United States Patent
Shao

(10) Patent No.: US 9,010,887 B1
(45) Date of Patent: Apr. 21, 2015

(54) STORAGE RACK ASSEMBLY WITH DETACHABLE CABINET

(71) Applicant: Hon Hai Precision Industry Co., Ltd., New Taipei (TW)

(72) Inventor: Chun-Hao Shao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/098,458

(22) Filed: Dec. 5, 2013

(30) Foreign Application Priority Data

Sep. 30, 2013 (TW) .............................. 102135287 A

(51) Int. Cl.
*A47B 95/00* (2006.01)
*H05K 7/18* (2006.01)

(52) U.S. Cl.
CPC ........................................ *H05K 7/18* (2013.01)

(58) Field of Classification Search
CPC ................. A47B 88/16; A47B 88/047; A47B 2088/0474; A47B 2210/0059; H05K 7/14; H05K 7/18; H05K 7/183; H05K 7/186
USPC ............ 312/319.1, 333, 330.1; 361/726, 727; 211/26; 292/340, 341, 341.15, DIG. 4
See application file for complete search history.

(56) References Cited

U.S. PATENT DOCUMENTS

| | | | | |
|---|---|---|---|---|
| 4,331,369 | A * | 5/1982 | Lazar et al. ...................... | 384/23 |
| 5,040,833 | A * | 8/1991 | Brunnert ......................... | 292/80 |
| 5,306,081 | A * | 4/1994 | Fukumoto ................ | 312/334.44 |
| 5,845,954 | A * | 12/1998 | DePue ........................ | 296/37.12 |
| 6,742,461 | B1 * | 6/2004 | Sen ................................... | 108/86 |
| 7,036,783 | B2 | 5/2006 | Chen et al. | |
| 7,854,486 | B2 * | 12/2010 | Sakamoto ...................... | 312/333 |
| 8,127,940 | B2 * | 3/2012 | Henderson et al. ............. | 211/26 |
| 2002/0158556 | A1 * | 10/2002 | Cheng ........................... | 312/333 |
| 2005/0194328 | A1 * | 9/2005 | Su .................................... | 211/26 |
| 2007/0018547 | A1 * | 1/2007 | Yang et al. ..................... | 312/333 |
| 2008/0030111 | A1 * | 2/2008 | Liu ............................... | 312/221 |
| 2008/0231156 | A1 * | 9/2008 | Hoshide et al. .......... | 312/334.46 |
| 2008/0237156 | A1 * | 10/2008 | Cheng-Yuan et al. .......... | 211/26 |
| 2010/0265651 | A1 * | 10/2010 | Huang et al. ............. | 361/679.39 |
| 2011/0100936 | A1 * | 5/2011 | Chang et al. .................... | 211/26 |
| 2011/0129172 | A1 * | 6/2011 | Liang et al. .................... | 384/22 |
| 2012/0001441 | A1 * | 1/2012 | Juan et al. ..................... | 292/164 |
| 2012/0038255 | A1 * | 2/2012 | Netzer et al. ................ | 312/319.1 |

(Continued)

FOREIGN PATENT DOCUMENTS

| | | |
|---|---|---|
| CN | 202759698 U | 2/2013 |
| TW | M243692 | 9/2004 |

(Continued)

*Primary Examiner* — Hanh V Tran
(74) *Attorney, Agent, or Firm* — Novak Druce Connolly Bove + Quigg LLP

(57) ABSTRACT

An exemplary storage rack assembly includes a rack, a cabinet and a mounting bracket fixed to the rack. The cabinet has an elastic component, and the elastic component has a hook exposed from the cabinet. The mounting bracket defines a sliding groove and a receiving channel communicating with the sliding groove. The hook slides along the sliding groove and into the receiving channel. The hook slides along a channel segment of the receiving channel under urging of an applied external force with the elastic component resiliently deforming until the hook reaches the channel segment. The elastic component resiliently recovers and drives the hook down to the end of the channel segment, and the hook resides in the end of the channel segment.

20 Claims, 10 Drawing Sheets

(56) References Cited

U.S. PATENT DOCUMENTS

2012/0161599 A1\* 6/2012 Chen et al. .................... 312/333
2012/0211447 A1\* 8/2012 Anderson et al. ............... 211/26

FOREIGN PATENT DOCUMENTS

TW M312181 5/2007
TW 201325395 A1 6/2013

\* cited by examiner

STORAGE RACK ASSEMBLY WITH DETACHABLE CABINET

BACKGROUND

1. Technical Field

The present disclosure relates to storage rack assemblies, such as those used for holding electronic equipment.

2. Description of Related Art

These days, it is common for a large number of electronic devices to be used at a single location and be stacked together for convenience and compactness. Such electronic devices include for example servers, workstations, and personal computers. Other items such as electronic components and other electronic equipment (e.g. hard disks) may also need to be conveniently stored. Typically, the electronic devices are in the form of cases (or cabinets), and various electronic components and equipment are housed in standard sized cases (or cabinets). The cases are detachably arranged one on top of the other in a storage rack. In order to conveniently assemble or disassemble each cabinet to or from the rack, two mounting brackets are usually fixed on two opposite surfaces of the cabinet. Then the mounting brackets are detachably fixed on the rack by some fasteners. Therefore a person installing the cabinet needs to hold the cabinet with one hand, and use a tool to install the cabinet into the rack with the other hand. However, a typical cabinet is quite heavy. Thus the assembly process may be quite dangerous and inconvenient. Also, similar problems exist in a disassembly process.

Therefore, a storage rack assembly capable of overcoming the above-described shortcomings is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
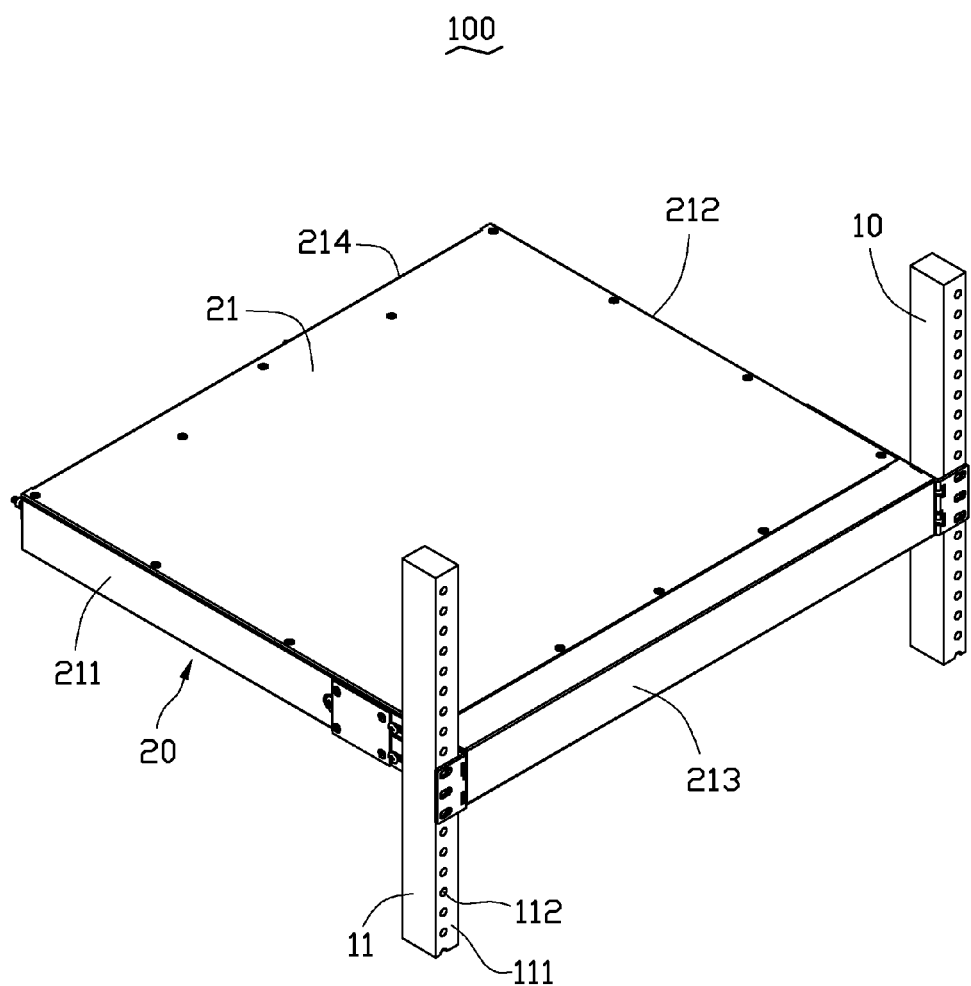
FIG. 1 is a schematic, isometric view of a storage rack assembly according to an exemplary embodiment.

Referring to FIG. 1, an embodiment of a storage rack assembly 100 includes a rack 10, a cabinet (or case) 20, and two mounting brackets 30 for installing the cabinet 20 to the rack 10. The cabinet 20 is connected to the rack 10 in a removable manner.

The rack 10 includes two vertically arranged fixed legs 11. Each of the fixed legs 11 has a front side 111, and the front side 111 defines a plurality of fixing holes 112. In this embodiment, the plurality of fixing holes 112 are aligned with each other along a vertical direction, and are equidistantly spaced from each other.

Figure 2:
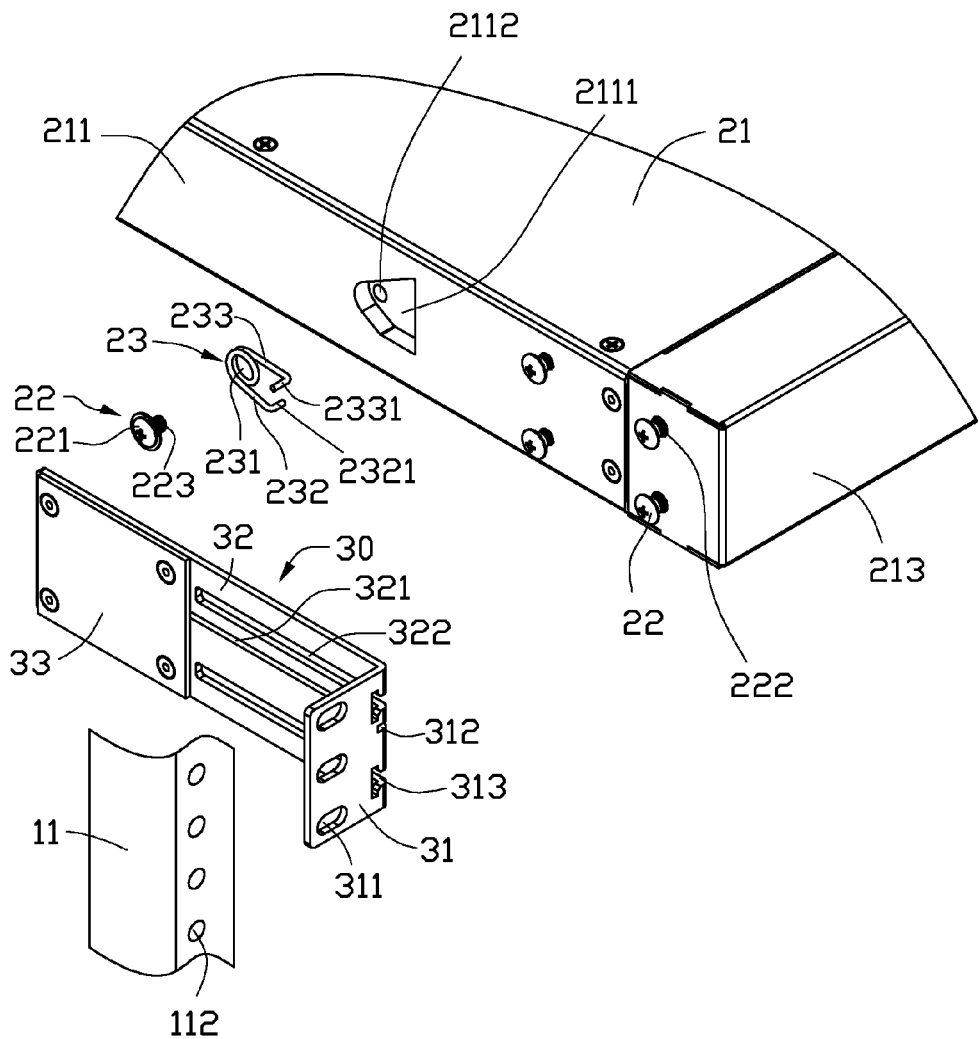
FIG. 2 is an enlarged, exploded view of part of the storage rack assembly of FIG. 1.
Figure 3:
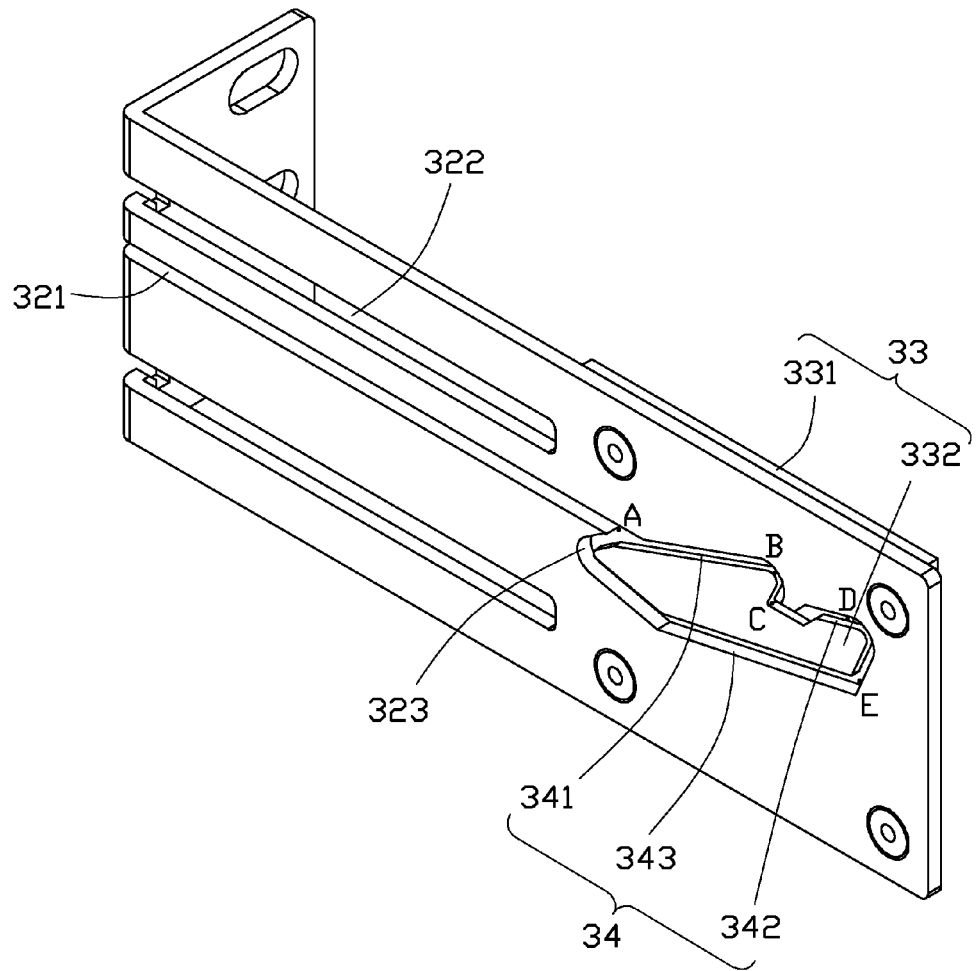
FIG. 3 is an enlarged view of a mounting bracket of FIG. 2, seen from another aspect.
Figure 4:
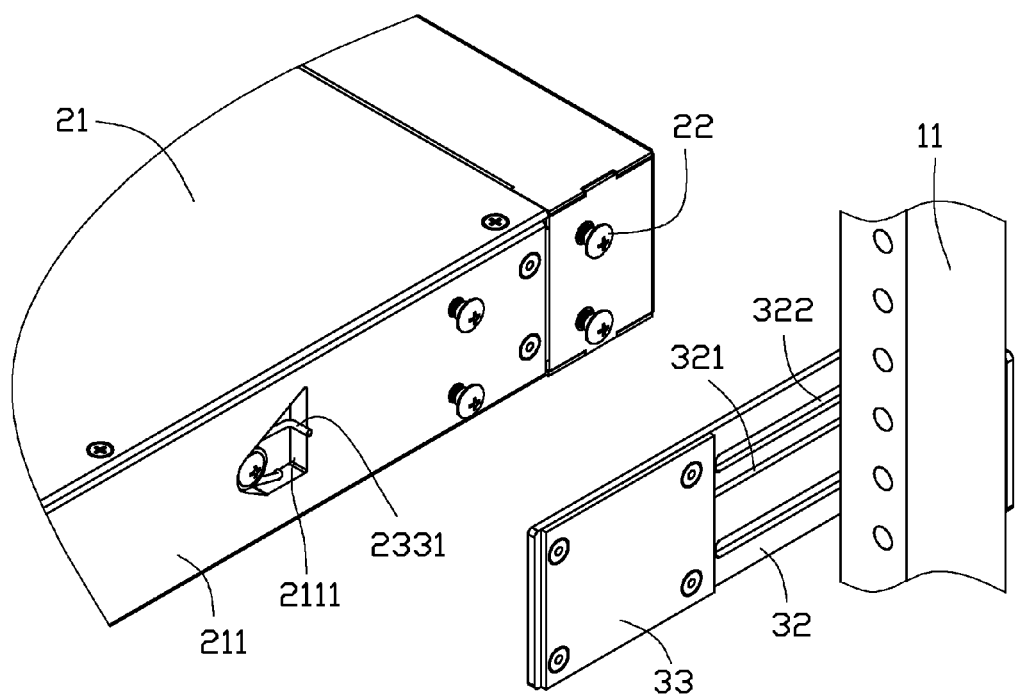
FIG. 4 is a partly assembled view of the storage rack assembly of FIG. 2, seen from another aspect.

Referring also to FIGS. 2-4, the cabinet 20 includes a main body 21, a plurality of screws 22 fixed to the two opposite sides of the main body 21, and two elastic components 23 (only one shown).

The main body 21 is cuboid-shaped, and includes a left surface 211, a right surface 212, a front surface 213, and a back surface 214. The plurality of screws 22 and the two elastic components 23 are respectively fixed on the left surface 211 and the right surface 212 symmetrically. The installing structure at the left surface 211 of the cabinet 20 and the installing structure at the right surface 212 of the cabinet 20 are the same.

Each of the screws 22 includes a head 221, and a pole 222 extending from one end of the head 221. A thread portion 223 is formed at one end of the pole 222 remote from the head 221.

A plurality of screws 22 is fixed on one end of the left surface 211 of the main body 21 adjacent to the front surface 213. In this embodiment, the plurality of screws 22 are four screws, which are arranged in a matrix of two rows and two columns. Additionally, part of the pole 222 of each screw 22 is exposed to the left surface 211, and thereby the head 221 of each screw 22 is spaced from the left surface 211. The left surface 211 defines a holding groove 2111 at a middle portion thereof, with the holding groove 2111 located rearward of the plurality of the screws 22. An inmost wall of the holding groove 2111 defines a threaded hole 2112 and a fixing hole (not shown). The threaded hole 2112 is perpendicular to the left surface 211.

Each elastic component 23 is a torsion spring. The elastic component 23 illustrated includes a coil portion 231, and a first leg 232 and a second leg 233 extending from an upper end and an lower end of the coil portion 231, respectively. In this embodiment, an inner diameter of the coil portion 231 of the left elastic component 23 is equal to that of the threaded hole 2112 of the left surface 211, and the first leg 232 and the second leg 233 are both L-shaped. One end of the first leg 232 is perpendicularly bent to form a first hook 2321, and one end of the second leg 233 is perpendicularly bent to form a second hook 2331. An extending direction of the first hook 2321 is opposite to that of the second hook 2331.

The elastic component 23 illustrated is fixed to the main body 21 by another screw 22. The thread portion 223 of the screw 22 passes through the coil portion 231 of the elastic component 23 and engages in the threaded hole 2112 at the left surface 211, and the first hook 2321 of the first leg 232 is positioned in the fixing hole of the holding groove 2111. Thus, the elastic component 23 is received in the holding groove 2111 and abuts against the head 221 of the screw 22. In an initial state, the second leg 233 of the elastic component 23 is positioned horizontally, and the second hook 2331 is exposed out of the left surface 211.

Each mounting bracket 30 is L-shaped, and includes a first plate 31, a second plate 32 perpendicularly extending from an edge of the first plate 31, and a baffle sheet 33 fixed on the second plate 32.

The first plate 31 defines a plurality of fixing holes 311 corresponding to the fixing holes 112 of the rack 10. In this embodiment, the fixing holes 311 are aligned in a vertical line, and are equidistantly spaced from each other. The first plate 31 defines a first opening 312 and two second openings 313 all close to an edge of the second plate 32. The first opening 312 is positioned between the two second openings 313, and is adjacent to an upper one of the second openings 313. Each second opening 313 receives the head 221 and part of the pole 222 of two corresponding screws 22 therethrough.

The positions of the two first openings 312 correspond to the positions of the four screws 22 at the front of the left surface 211 of the main body 21.

The second plate 32 defines a horizontal first sliding groove 321 and two horizontal second sliding grooves 322. The first and second sliding grooves 321, 322 all run from a middle portion of the second plate 32 to a front end of the second plate 32 close to the first plate 31. An upper one of the second sliding grooves 322 is aligned and communicated with the upper second opening 313 of the first plate 31 in a horizontal line. A lower one of the second sliding grooves 322 is aligned and communicated with a lower one of the second openings 313 of the first plate 31 in a horizontal line. The first sliding groove 321 is aligned and communicated with the first opening 312 of the first plate 31 in a horizontal line. A length of the first sliding groove 321 is greater than that of each of the second sliding grooves 322. The second plate 32 defines a guiding groove 323 positioned away from the first plate 31, the guiding groove 323 communicated with a rear end of the first sliding groove 321.

The baffle sheet 33 includes a third plate 331, and a baffle block 332 protruding inward from the third plate 331. The third plate 331 is fixed on a rearward portion of the second plate 32 away from the first plate 31 by a plurality of rivets. The baffle block 332 is received in the guiding groove 323 of the second plate 32. A thickness of the baffle block 332 is equal to that of the second plate 32. A shape of the baffle block 332 is the same as that of the guiding groove 323 of the second plate 32, and a size of the baffle block 332 is less than that of the guiding groove 323 of the second plate 32. Thus, the baffle block 332 and the second plate 32 cooperatively define a receiving channel 34. The receiving channel 34 is in the shape of an irregular closed loop, and is communicated with the rear end of the first sliding groove 321.

The receiving channel 34 includes a first channel segment 341, a second channel segment 342 and a third channel segment 343 arranged in that sequence and communicated end to end to form the closed loop. A connecting point A is defined between the receiving channel 34 and the first sliding groove 321. The first channel segment 341 extends obliquely and upwardly along a direction remote from the first plate 31 from the point A to a highest point B of the first channel segment 341, and then extends a distance obliquely and downwardly along a direction toward the first plate 31 to a point C. The second channel segment 342 extends obliquely and upwardly along a direction remote from the first plate 31 from the point C to a highest point D of the second channel segment 342, and then extends obliquely and downwardly along a direction toward the first plate 31 to a point E. The third channel segment 343 extends along a direction toward the first plate 31 from the point E to the point A. In particular, the third channel segment 343 extends obliquely and downwardly along a direction toward the first plate 31 from the point E to a lowest point of the third channel segment 343, then extends obliquely and upwardly along a direction toward the first plate 31 from the lowest point to a frontmost point of the third channel segment 343, and then extends obliquely and upwardly along a direction remote from the first plate 31 from the frontmost point to the point A. In this embodiment, the point B of the first channel segment 341 is slightly higher than the point D of the second channel segment 342.

Figure 5:
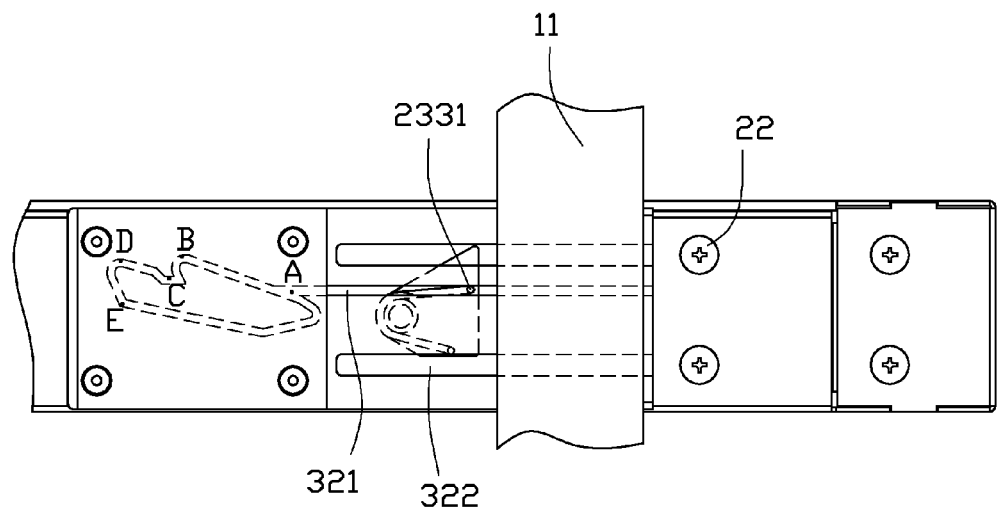
FIGS. 5-10 are the left side views of the storage rack assembly of FIG. 1, showing six other states of the storage rack assembly, respectively.
Figure 6:
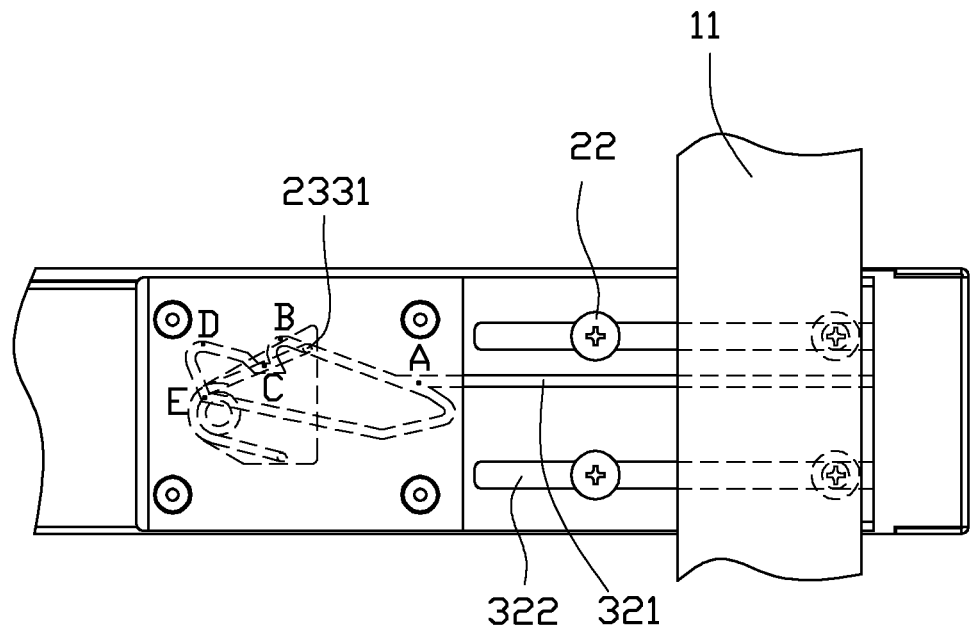
Figure 7:
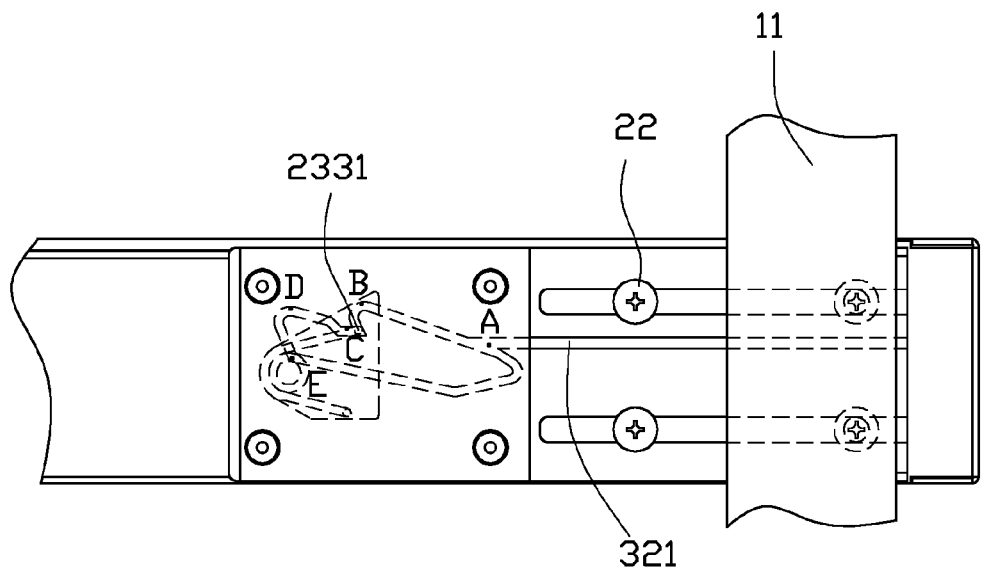

In a process of assembling the storage rack assembly 100, firstly, the fixing holes 311 of each mounting bracket 30 are positioned to respectively face the fixing holes 112 of the corresponding fixed legs 11, and the two mounting brackets 30 are connected to the rack 10 respectively by fastenings (not shown). Then, the cabinet 20 is pushed rearward by a user (installer) into the two mounting brackets 30. Thereby, the second hook 2331 of each elastic component 23 is pushed into the first sliding groove 321 through the first opening 312 of the corresponding mounting bracket 30. Referring to FIGS. 5-7, in a process of the second hook 2331 of the illustrated elastic component 23 sliding from the first sliding groove 321 of the corresponding mounting bracket 30 to the receiving channel 34, the four screws 22 at the front of the left surface 211 of the main body 21 slide along the two second sliding grooves 322 of the mounting bracket 30. When the second hook 2331 of the elastic component 23 slides into the first channel segment 341 of the receiving channel 34 under urging of the external force, the second leg 233 of the elastic component 23 rotates counterclockwise and deforms slightly relative to the coil portion 231, and the second hook 2331 rides along a top end of the baffle block 332. When the second hook 2331 of the elastic component 23 reaches the point B of the first channel segment 341, the elastic component 23 resiliently recovers (rebounds), and the second hook 2331 rotates clockwise and moves downward and becomes positioned at the point C. In this state, the cabinet 20 is installed into the rack 10 and is unable to be pulled forward and out from the rack 10.

Figure 8:
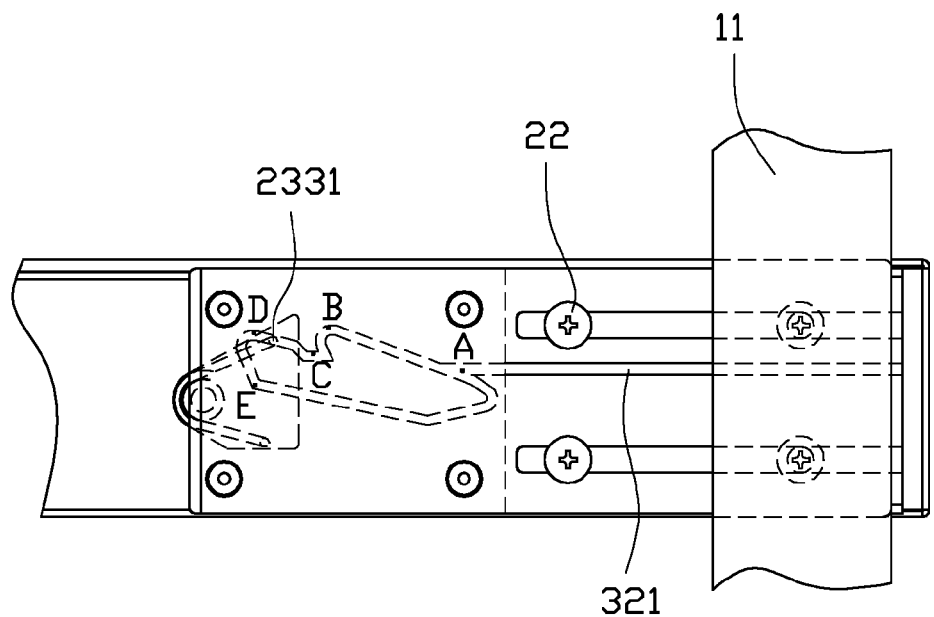
Figure 9:
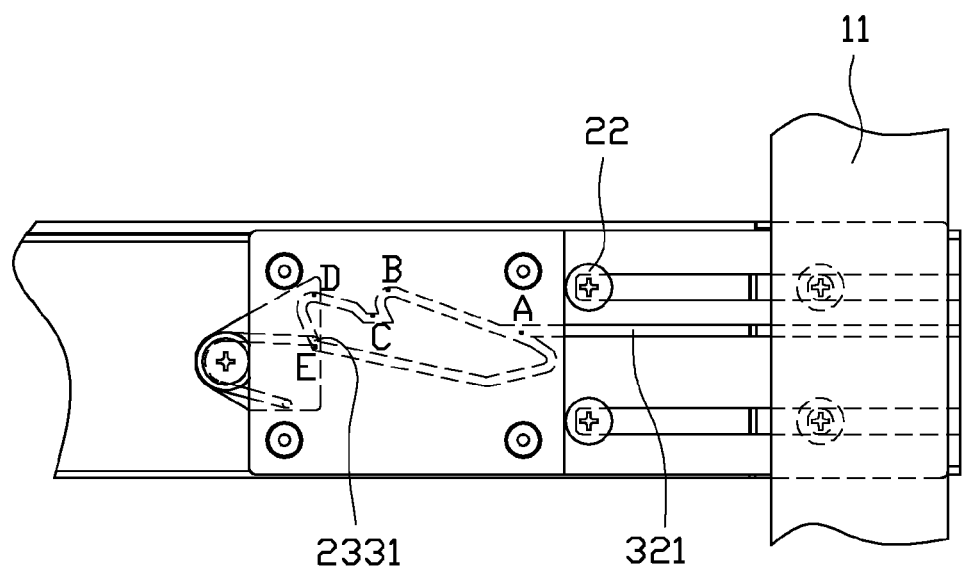
Figure 10:
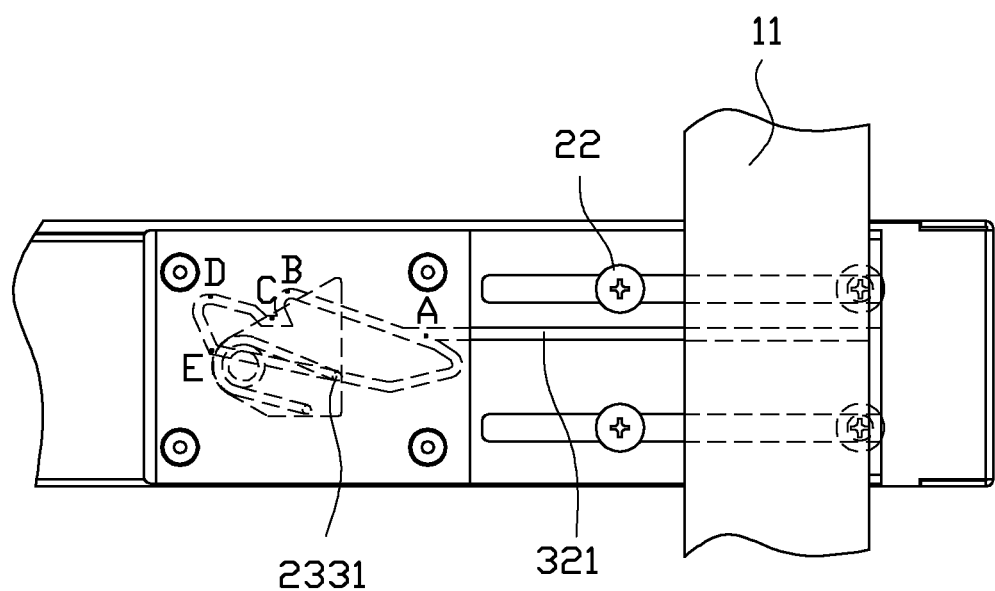

Referring to FIGS. 8-10, when the cabinet 20 needs to be pulled out from the rack 10, firstly, a rearward force is applied to the main body 21 of the cabinet 20 by a user. Thereby, the second leg 233 of the illustrated elastic component 23 rotates counterclockwise and deforms slightly relative to the coil portion 231 again, and the second hook 2331 rides along the top end of the baffle block 332. When the second hook 2331 of the elastic component 23 reaches the highest point D of the second channel segment 342, the elastic component 23 resiliently recovers, and the second hook 2331 rotates clockwise and moves downward and becomes positioned at the point E. Secondly, a forward force is applied to the main body 21 of the cabinet 20 by the user, and the second hook 2331 first resiliently deforms and then resiliently recovers while the second hook 2331 travels along the third channel segment 343 from the point E to the point A. Thirdly, the forward force continues to be applied to the main body 21, and thereby the cabinet 20 is pulled out from the rack 10 along the first sliding grooves 321.

Thus in a process of assembling the storage rack assembly 100, the mounting brackets 30 are fixed to the rack 10 before a cabinet 20 is installed in the rack 10. A user can hold the cabinet 20 with two hands, and slide the second hooks 2331 of the elastic components 23 of the cabinet 20 into the receiving channels 34 of the mounting brackets 30 until the cabinet 20 is fixed in position and cannot be pulled forward and out from the rack 10. When the cabinet 20 needs to be removed, for example when the cabinet 20 or the storage rack assembly 100 needs to be repaired, the main body 21 of the cabinet 20 is first pushed rearward by a user, and then pulled forward. In doing so, the user can hold the cabinet 20 with two hands. Thus, in both the assembly process and the disassembly process, the operation is safe and convenient.

The above-described particular embodiments are shown and detailed by way of illustration only. The principles and the features of the present disclosure may be employed in various and numerous embodiments thereof without departing from the scope of the disclosure. The above-described embodiments illustrate the scope of the disclosure but do not restrict the scope of the disclosure.

What is claimed is:
1. A storage rack assembly comprising:
a rack;

a cabinet, the cabinet comprising an elastic component, the elastic component comprising a first hook exposed from the cabinet; and a mounting bracket fixed to the rack, the mounting bracket defining a first sliding groove and a receiving channel communicating with the first sliding groove, the receiving channel comprising a first channel segment, a second channel segment and a third channel segment in that sequence, the first channel segment extending obliquely and upwardly from a rear end of the first sliding groove along a direction remote from the first sliding groove to a highest point of the first channel segment, and then extending obliquely and downwardly along a direction toward the first sliding groove to an end of the first channel segment, the second channel segment extending obliquely and upwardly along a direction remote from the first sliding groove from the end of the first channel segment to a highest point of the second channel segment, and then extending obliquely and downwardly along a direction toward the first sliding groove to an end of the second channel segment, and the third channel segment extending from the end of the second channel segment to the rear end of the first sliding groove;

wherein when the cabinet is installed in the rack, the first hook slides along the first sliding groove and into the receiving channel, and the first hook slides along the first channel segment under urging of an applied external force with the elastic component resiliently deforming until the first hook reaches the highest point of the first channel segment, whereupon the elastic component resiliently recovers and drives the first hook down to the end of the first channel segment, and the first hook resides in the end of the first channel segment.

2. The storage rack assembly of claim 1, wherein the cabinet comprises a main body, and the main body comprises a left surface and a right surface at opposite sides thereof; and when the cabinet is installed in the rack, one of the left surface and the right surface of the main body abuts the mounting bracket.

3. The storage rack assembly of claim 2, wherein the mounting bracket is L-shaped, and comprises a first plate and a second plate perpendicularly extending from an edge of the first plate, the first sliding groove is defined in the second plate, and the first plate is fixed to the rack.

4. The storage rack assembly of claim 3, wherein the second plate defines a guiding groove communicating with the first sliding groove, the guiding groove is positioned remote from the first plate, the mounting bracket further comprises a third plate and a baffle block protruding from the third plate, the third plate is fixed to the second plate, the baffle block is received in the guiding groove of the second plate, and the receiving channel is cooperatively defined by the baffle block and the second plate.

5. The storage rack assembly of claim 4, wherein a thickness of the baffle block is equal to that of the second plate, a shape of the baffle block is the same as that of the guiding groove of the second plate, and a size of the baffle block is less than that of the guiding groove of the second plate.

6. The storage rack assembly of claim 3, wherein a plurality of screws is engaged in the main body at said one of the left surface and the right surface, each of the screws comprises a head, a pole extending from one end of the head, and a thread portion formed at one end of the pole remote from the head, and part of the pole of each screw is exposed to said one of the left surface and the right surface, whereby the head of each screw is spaced from said one of the left surface and the right surface.

7. The storage rack assembly of claim 6, wherein the second plate further defines a second sliding groove close to the first plate, the second sliding groove is parallel to the first sliding groove, and the pole of each screw of said one of the left surface and the right surface is slidable along the second sliding groove.

8. The storage rack assembly of claim 7, wherein the first plate defines a first opening and a second opening both close to an edge of the second plate, the first opening of the first plate is aligned and communicated with the first sliding groove in a horizontal line, the second opening of the first plate is aligned and communicated with the second sliding groove in a horizontal line, and the head and part of the pole of each screw of said one of the left surface and the right surface is passable through the second opening.

9. The storage rack assembly of claim 1, wherein the highest point of the first channel segment is higher than the highest point of the second channel segment.

10. The storage rack assembly of claim 1, wherein the elastic component is a torsion spring, and further comprises a coil portion, and a first leg and a second leg extending from an upper end and a lower end of the coil portion, respectively, and the first hook is provided at an end of the first leg.

11. The storage rack assembly of claim 10, wherein the first leg and the second leg are both L-shaped, one end of the first leg is perpendicularly bent to form the first hook, one end of the second leg is perpendicularly bent to form a second hook engaged with the cabinet, and an extending direction of the first hook is opposite to that of the second hook.

12. A storage rack assembly comprising:
a rack;
a cabinet, the cabinet comprising a main body and an elastic component, the main body comprising a left surface and a right surface, the elastic component comprising a first hook exposed from the cabinet at one of the left surface and the right surface; and
a mounting bracket fixed to the rack, the mounting bracket defining a first sliding groove and a receiving channel communicating with the first sliding groove, the receiving channel comprising a first channel segment, a second channel segment and a third channel segment in that sequence, the first channel segment extending rearwardly and upwardly from a rear end of the first sliding groove to a highest point of the first channel segment, and then extending forwardly and downwardly to an end of the first channel segment, the second channel segment extending rearwardly and upwardly from the end of the first channel segment to a highest point of the second channel segment, and then extending forwardly and downwardly to an end of the second channel segment, the third channel segment extending from the end of the second channel segment to the rear end of the first sliding groove, the highest point of the first channel segment being higher than the highest point of the second channel segment;
wherein when the cabinet is installed in the rack under urging of an applied external force, the first hook slides along the first sliding groove and into the receiving channel, the first hook slides along the first channel segment with the elastic component resiliently deforming until the first hook reaches the highest point of the first channel segment, whereupon the elastic component resiliently recovers and drives the first hook down to the end of the first channel segment, and the first hook resides in the end of the first channel segment.

13. The storage rack assembly of claim 12, wherein the mounting bracket is L-shaped, and comprises a first plate, a second plate perpendicularly extending from an edge of the first plate, the first sliding groove is defined on the second plate, and the first plate is fixed to the rack.

14. The storage rack assembly of claim 13, wherein the second plate defines a guiding groove communicating with the first sliding groove, and the guiding groove is positioned remote from the first plate, the mounting bracket further comprises a third plate and a baffle block protruding from the third plate, the third plate is fixed to the second plate, and the baffle block is received in the guiding groove of the second plate, the receiving channel is cooperatively defined by the baffle block and the second plate.

15. The storage rack assembly of claim 14, wherein a thickness of the baffle block is equal to that of the second plate, a shape of the baffle block is the same as that of the guiding groove of the second plate, and a size of the baffle block is less than that of the guiding groove of the second plate.

16. The storage rack assembly of claim 13, wherein the left surface and the right surface of the main body respectively and symmetrically form a plurality of screws, each of the screws comprises a head, a pole extending from one end of the head, a thread portion is formed at one end of the pole remote from the head, part of the pole of each screw is exposed to the left surface or the right surface, thereby the head of each screw is spaced from the left surface or the right surface.

17. The storage rack assembly of claim 16, wherein the second plate further defines a second sliding groove closed to the first plate, the second sliding groove is parallel to the first sliding groove, the pole of each screw of the left surface or the right surface can slide along the second sliding groove.

18. The storage rack assembly of claim 17, wherein the first plate defines a first opening and a second opening closed to an edge of the second plate, the first opening of the first plate is aligned and communicated with the first sliding groove in horizontal line, the second opening of the first plate is aligned and communicated with the second sliding groove in horizontal line, the head and part pole of each screw installed on the cabinet is received in received in the second opening.

19. The storage rack assembly of claim 12, wherein the elastic component is a torsion spring, and further comprises a coil portion, and a first leg and a second leg extending from an upper end and a lower end of the coil portion, respectively, and the first hook is provided at an end of the first leg.

20. The storage rack assembly of claim 19, wherein the first leg and the second leg are both L-shaped, one end of the first leg is perpendicularly bent to form the first hook, one end of the second leg is perpendicularly bent to form a second hook engaged with the cabinet, and an extending direction of the first hook is opposite to that of the second hook.

* * * * *